United States Patent [19]
Fogg

[11] Patent Number: 5,870,266
[45] Date of Patent: Feb. 9, 1999

[54] BRIDGE CONTROL CIRCUIT AND METHOD

[75] Inventor: John K. Fogg, Durham, N.C.

[73] Assignee: Harris Corporation, Melbourne, Fla.

[21] Appl. No.: 656,987

[22] Filed: Jun. 6, 1996

Related U.S. Application Data

[63] Continuation of Ser. No. 261,996, Jun. 17, 1994, abandoned.
[51] Int. Cl.⁶ ............................................. H02H 3/24
[52] U.S. Cl. ............................. 361/92; 361/33; 363/58; 363/41
[58] Field of Search ................................ 361/18, 92, 23, 361/33, 21, 31; 363/41, 50, 58

[56] References Cited

U.S. PATENT DOCUMENTS

| | | | |
|---|---|---|---|
| 4,748,550 | 5/1988 | Okado | 363/41 |
| 4,999,556 | 3/1991 | Masters | 318/599 |

*Primary Examiner*—Sally C. Medley
*Attorney, Agent, or Firm*—Rogers & Killeen

[57] ABSTRACT

A method and control circuit for an electronic switch, and more particularly the high side switch in a bridge circuit. Control is established by continuous and/or the combination of continuous and pulsed signals. Fail safe undervoltage protection is provided for the high side switch based on the adequacy of both high side and low side control voltages.

24 Claims, 6 Drawing Sheets

LEVEL SHIFT

RECEIVER

UNDER VOLT.

BRIDGE CONTROL CIRCUIT AND METHOD

This is a continuation of application Ser. No. 08/261,996, filed Jun. 17, 1994 now abandoned.

BACKGROUND OF THE INVENTION

The present invention relates to a control circuit for an electronic switch, and more particularly to the control circuit for the high side switches of a bridge such as an H bridge, a half bridge, a three-chase bridge, or a full bridge. Such a bridge is typically used in a situation where the high side and low side switches alternatively conduct in counterposition to one another. Such bridges are especially useful to transfer direct current power from a bus to alternating current power in a load element or vice versa, as well as for performing full or half wave rectification. These bridges are also used extensively in audio amplifiers, motor controllers, DC/DC converters, noise cancellation systems, electronic lamp ballasts, and Uninterruptible Power Supply systems (UPS) applications.

As indicated, bridge circuits are well known and, as schematically illustrated for a H-bridge circuit in FIG. 1A, a half bridge circuit in FIG. 1B and a 3-phase bridge in FIG. 1C, include a circuit in which direct current from a source V may be selectively passed through a load through the operation of various high side and low side switches.

With reference to FIG. 1A by way of example, switches SW 1 and SW 4 in one direction and alternatively, through switches SW 3 and SW 2 in the opposite direction, thus alternating the current through the load. In such circuits, the operation of the switches SW 1–SW 4 are typically controlled by a relatively low voltage control circuit 10 illustrated in FIG. 1A for switch SW 1.

The control circuit 10 is typically provided with one or more sources of power from a power supply 12 and receives operating instructions from a logic circuit 14. In general, the control circuits for the two high side switches SW 1 and SW 3 are identical, as are the control circuits for the low side switches SW 2 and SW 4. However, the control circuits for the high side switches are not necessarily identical to the control circuits for the low side switches. The power supplies for the control circuits may be shared and a common logic circuit is conventional for ensuring that the switches SW 1–SW 4 operate simultaneously and in pairs.

One of the main design issues of the bridge topology is control of the high side switch since it is not ground referenced. With reference to FIG. 1A, the high side switch is referenced to VS which floats between values dependant upon which switches are conducting.

The design issues for the high side switch control circuit include power dissipation, noise immunity, propagation delay, and undervoltage protection. Power dissipation is important because even microamperes of current at the high side voltages can result is high power dissipation. Because of the desirability of controlling power dissipation in the control circuits, the output signals from the control circuits typically "latch" pending a further instruction from the associated logic circuit, and are hereinafter sometimes referenced as "pulse" control signals. Known latching circuits may be implemented with discrete components or on an integrated circuit ("IC").

While power is thus conserved, circuits which latch are susceptible to latching in an undesirable state under the influence of an external event such as transient noise or lightning, generally resulting in the destruction of the bridge circuit.

The lack of noise immunity is a concern because the large voltage transients associated with switching, ESD events, and even supply voltage transients can disrupt control of the bridge. In control circuits using discrete components, it is known to accept the power dissipation of continuous non-latching control signals (hereinafter sometimes referenced as "continuous" control signals) to control the operation of the high side switches. This technique is not used in ICs because it requires large IC devices, high power dissipation, and it results in slow switching speeds.

Propagation delay is also important because of the desirability of high frequency operation, and, more importantly, to be able to match the propagation delay of the high and low sides of the bridge to achieve balance across the load. The present invention, by initiating switching with short duration pulse signals, permits precise control of the timing without consuming excessive power.

Undervoltage protection circuitry is also required for the control circuits to insure switch operation, for high side switch conduction when there is inadequate power to control the low side switches can destruct the bridge. In the known prior art, the failure of the low side power supply results in the sending of a turn off or inhibit signal from the low side to the high side when a low side undervoltage condition existed. However, such solutions presumed that there was sufficient voltage to send the turn off signal, and were not fail safe.

It is accordingly an object of the present invention to obviate many of the foregoing problems and to provide a novel switch control circuit and method.

It is another object of the present invention to provide a novel method and integrated circuit for the non-latching, continuous control of the conduction of a high side switch.

Another object of the present invention is to provide a novel bridge with IC control circuitry for high side switch conduction control using continuous control signals.

Still another object of the present invention is to provide a novel method and circuit for controlling the high side switches of a bridge by a combination of pulse and continuous control signals, all without effecting a latch.

It is yet another object of the present invention to provide a novel method and fail safe undervoltage protection circuit.

A further object of the present invention is to provide a novel bridge with undervoltage protection for the circuits which control switch conduction.

These and many ocher objects and advantages of the present invention will be apparent to one skilled in the art from the claims and from the following detailed description when read in conjunction with the appended drawings.

DESCRIPTION OF PREFERRED EMBODIMENTS

Figure 1A:
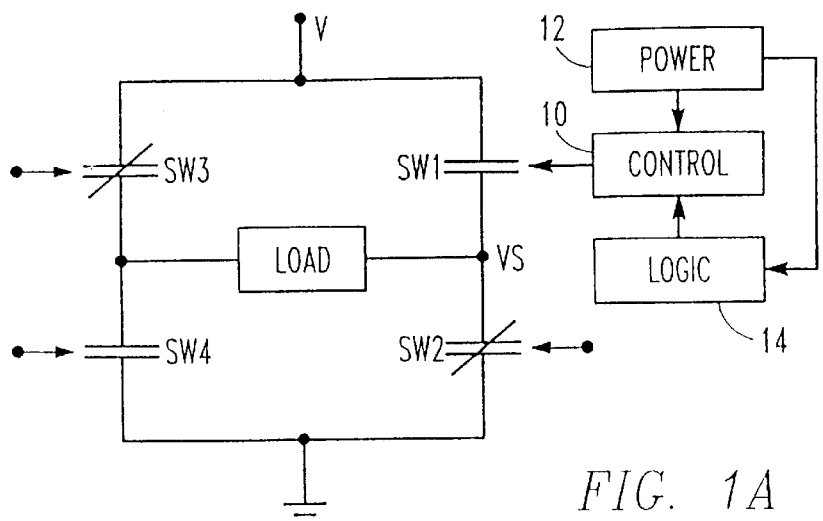
FIG. 1A is a schematic diagram or a prior art H bridge circuit.
Figure 2:
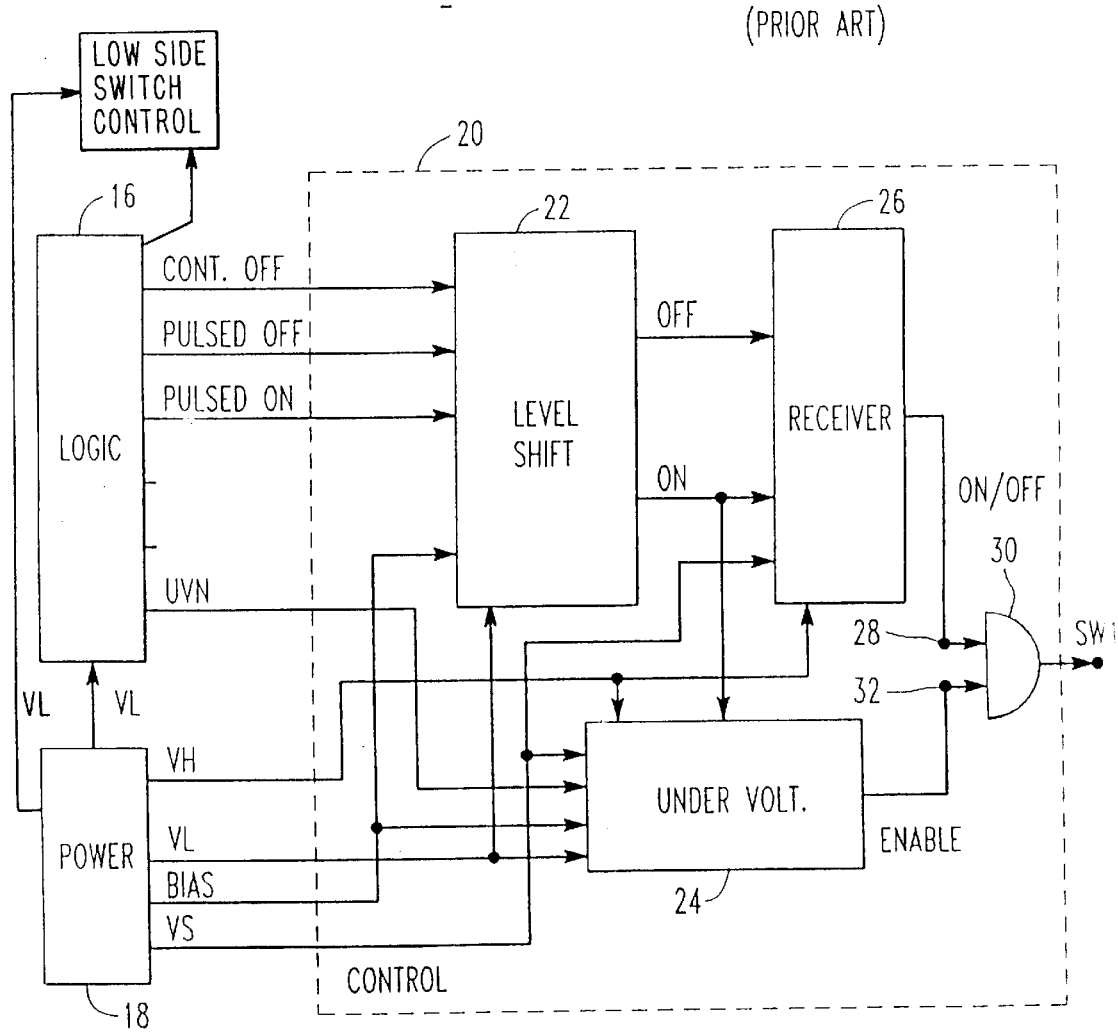
FIG. 2 is a functional block diagram of one embodiment of the control, logic and cower circuit of the present invention used to control one of the high side switches in the bridge of FIG. 1.
Figure 1B:
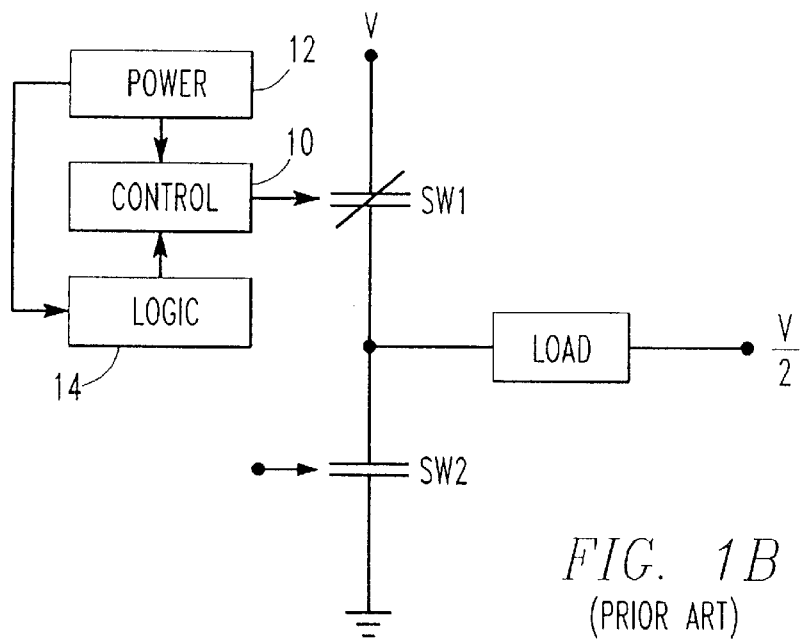
FIG. 1B is a schematic diagram of a prior art half bridge circuit.
Figure 1C:
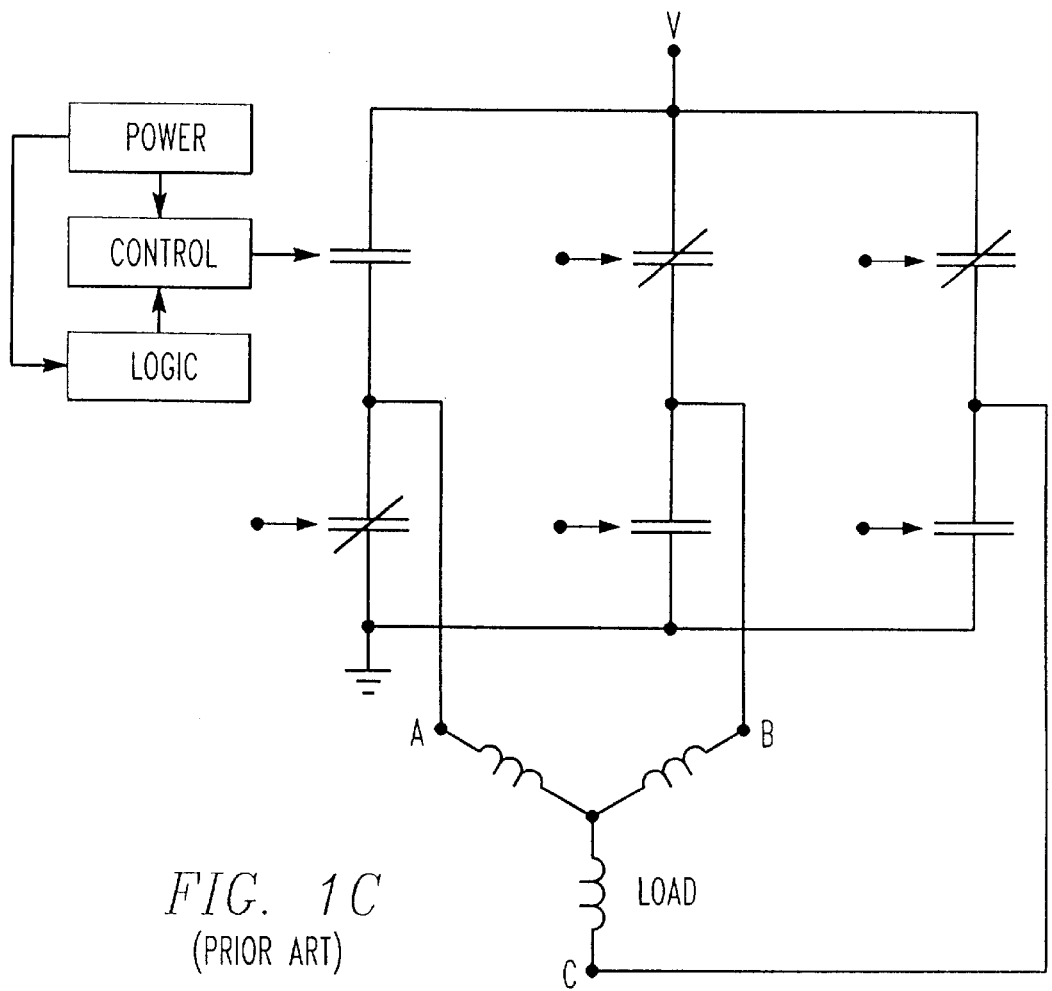
FIG. 1C is a schematic diagram of a prior art 3-phase bridge circuit.

FIG. 2 illustrates one embodiment of the control circuit of the present invention. The circuit of FIG. 2 may be utilized in the circuit of FIG. 1 to control the operation of the high side switches SW 1 and SW 3, with any suitable conventional logic, control and power circuit controlling the operation of the low side switches SW 2 and SW 4.

As earlier indicated, the control of all four of the switches SW 1–SW 4 may be under the same logic circuit, the circuit of which may be implemented in any suitable conventional manner to provide the signals indicated. Similarly, the power supply for the control circuits for the four switches of the bridge of FIG. 1 may be shared, or may be all individual to a particular switch as desired.

With reference to FIG. 2, a logic circuit 16 receives the low side switch control voltage source VL from a power supply 18, from which it derives an "undervoltage not" or UVN signal to the undervoltage circuit 24 indicative of an acceptable level of low side supply voltage VL. The power supply 18 also provides the low side switch control voltage VL to the undervoltage 24 and revel shift 22 circuits, and a high side switch control voltage VH to the undervoltage circuit 24 and the receiver 26. In addition, the power supply 18 may provide a current BIAS to the level shift circuit 22 as well as to an undervoltage circuit 24 within the control circuit 20.

The logic circuit 16 also provides a CONT.OFF signal, a PULSED OFF signal, and a PULSED ON signal (if UVN is present) to the level shift circuit 22. As will be explained below in greater detail in connection with FIG. 3, the level shift circuit 22 is responsive to the VL, CONT.OFF, PULSED OFF, and PULSED ON signals as well as the BIAS current to provide mutually exclusive output signals OFF or ON indicative of the desired state of conduction of the switch being controlled.

Both the ON and OFF signals are provided to a receiver 26, the output signal ON/OFF from which is indicative of the desired state of the switch being controlled. The ON/OFF signal is passed to one input terminal 28 of a two input terminal AND gate 30, the output of which is provided as the control circuit OUTPUT signal to control the conduction of the high side switch SW 1.

With continued reference to FIG. 2, the ON output signal from the level shift circuit 22 is also provided to the undervoltage circuit 24. The undervoltage circuit 24, as explained below in connection with FIG. 5, will provide an ENABLE signal in response to the simultaneous presence of adequate voltage levels in the control circuits for both the high side switches and low side switches of the bridge.

To provide greater noise immunity, the ON signal from the level shift circuit 22 is provided to the undervoltage circuit 24. The ENABLE signal is applied to the other input terminal 32 of the AND gate 30 to enable the passage therethrough of the ON/OFF signal from the receiver 26 as the SW 1 conduction controlling signal.

Figure 6:
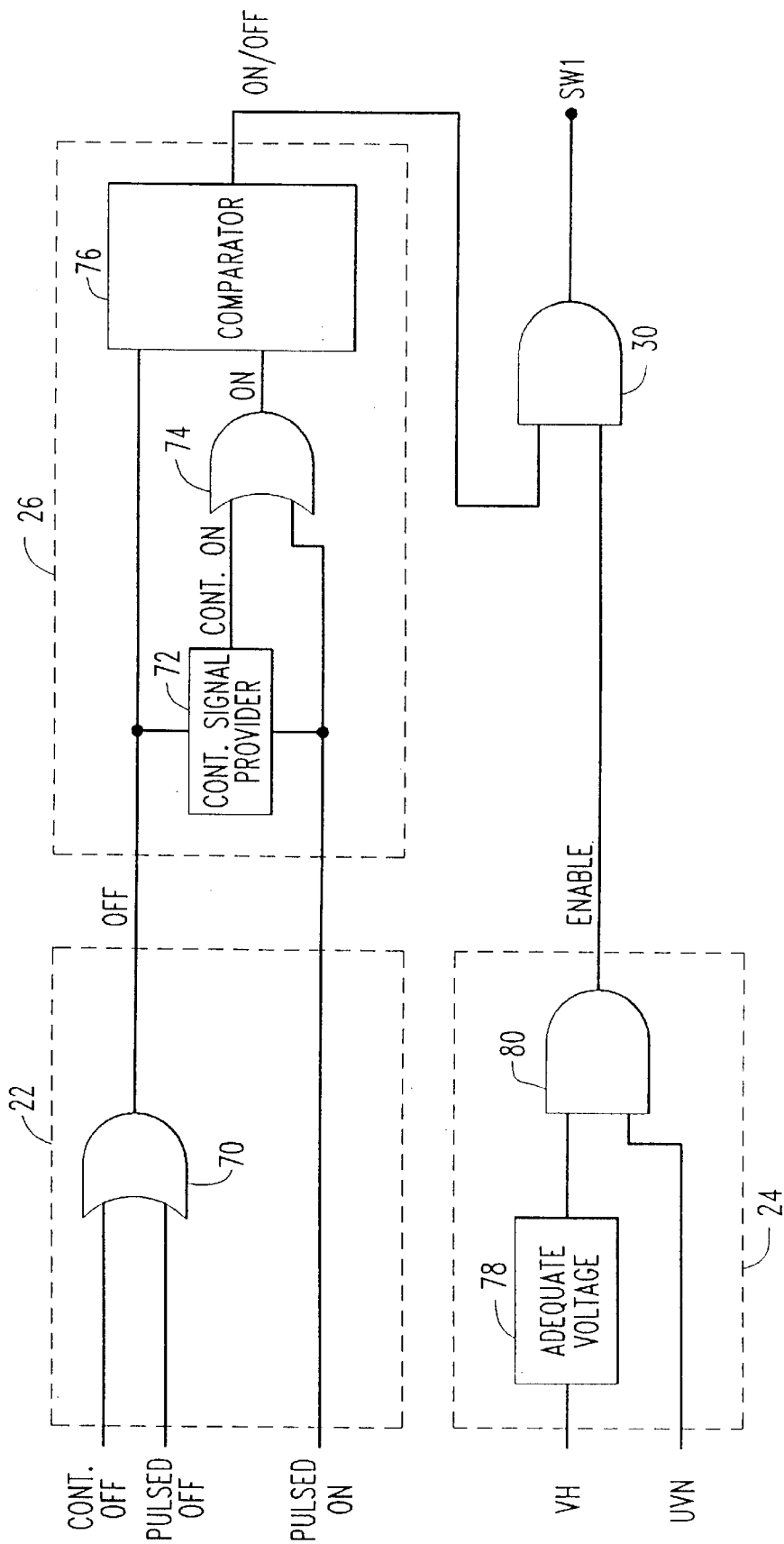
FIG. 6 is a logic level schematic of one embodiment of the control circuit of FIG. 2.

The operation of the circuit of FIG. 2 may be more readily understood by reference to the logic diagram of FIG. 6. With reference to FIG. 6, the level shifter 22 receives as input signals a CONTINUOUS OFF, PULSED OFF, and PULSED ON signal from the logic circuit 16. The CONT.OFF signal is passed to one terminal of a two terminal OR gate 70. The pulsed off signal is passed to the other terminal of OR gate 70. The output of OR gate 70 represents the OFF signal output of the level shifter and the PULSED ON signal is passed through the level shifter.

With continued reference to FIG. 6, the receiver 26 receives as input signals the OFF signal from the level shifter and the PULSED ON signal from the level shift circuit 22. The continuous signal provider 72 will provide a CONT. ON signal once it receives the PULSED ON signal and it will continue to provide the CONT.ON signal until it receives the OFF signal. This continuous signal provider 72 may be designed in any suitable conventional manner such as are known to those skilled in the art.

The CONT.ON signal is provided to one terminal of a two terminal OR gate 74. The PULSED ON signal is applied to the other terminal of OR gate 74 and the output signal from the OR gate 74 represents the ON signal. The comparator 76 compares the signals present at the input terminals and provides either an ON or OFF signal as appropriate. This comparator 74 may also be any suitable conventional circuit known to those skilled in the art for performing the indicated function.

While the provision of the ON/OFF signal could be based solely on the presence or absence of the CONT. OFF signal depending upon the particular analog components used to construct the receiver and the switching frequencies involved, one skilled in the art will also recognize the benefits of requiring an additional ON signal. Such benefits could include increased switching speed, decreased power dissipation, noise immunity and improved timing.

The ON/OFF signal from the receiver 26 is sent to one terminal of a two terminal AND gate 30. If the AND gate 30 is enabled by the ENABLE signal from the undervoltage protection circuit, the ON/OFF signal from the receiver is passed through to the switch which the control circuitry is controlling.

With continued reference to FIG. 6, the undervoltage protection circuit 24 receives as an input signal both the UVN signal and the high side supply voltage VH. The UVN signal establishes that there is adequate low side voltage to operate the low side switches, and in the presence of adequate high side supply voltage VH for the high side switches as determined by a circuit 78, the AND gate 80 provides the ENABLE signal. The design of the circuit 78 is within the skill of those skilled in this art.

From the foregoing, it may be seen that either a CONT. OFF or PULSED OFF signal will provide an OFF signal, and that either a CONT. ON (derived from the absence of the OFF signal) or PULSED ON signals will provide an ON signal. One or the other, but not both of the ON or OFF signals will be provided to the gate which controls switch conduction.

It will also be seen that adequate high side and low side control voltages must be present to enable the gate which controls switch conduction.

Figure 3:
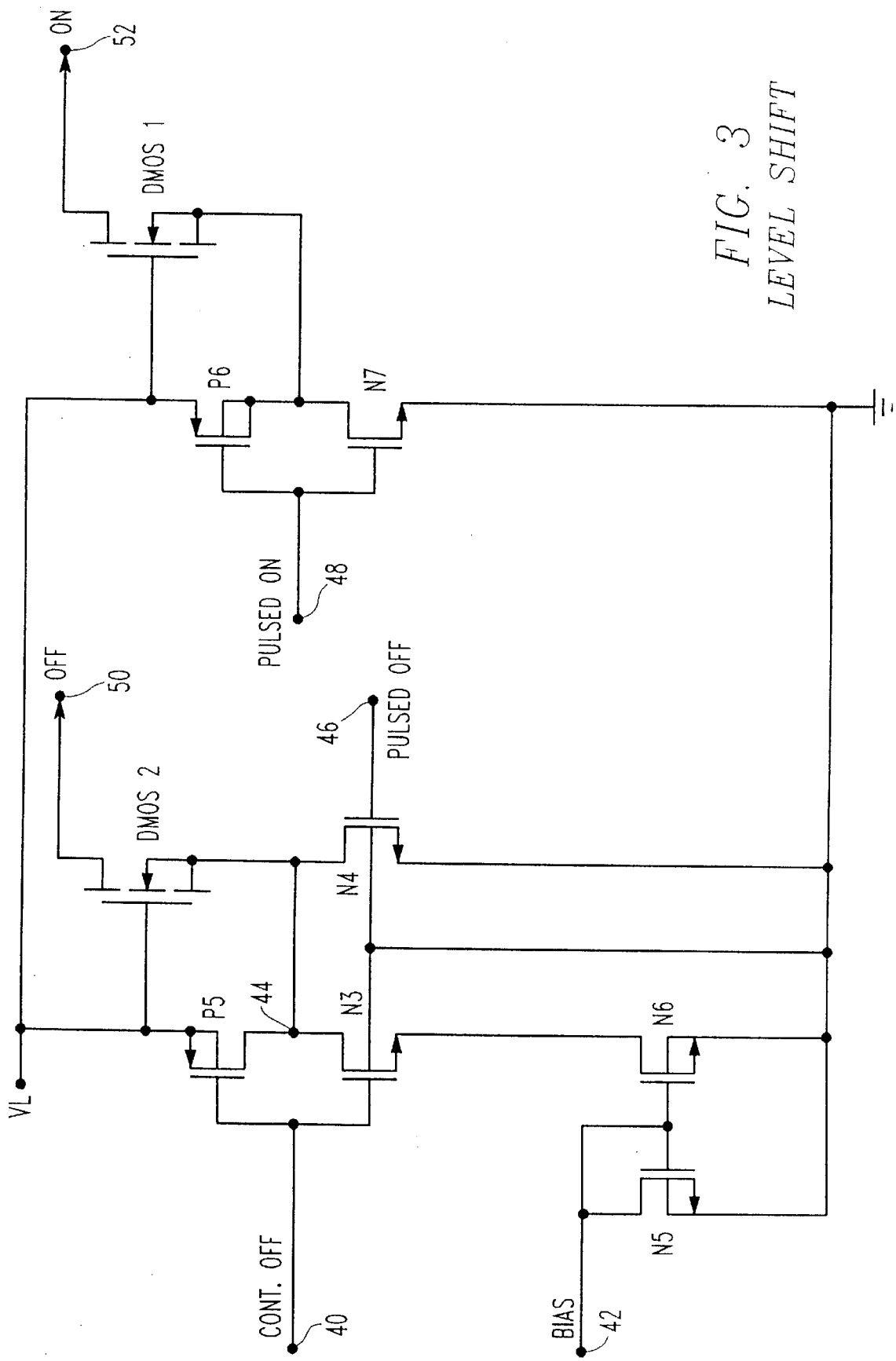
FIG. 3 is a schematic circuit diagram or one embodiment of the level shift circuit of FIG. 2.

With reference to the level shift circuit 22 illustrated in FIG. 3, the CONT.OFF signal provided by the logic circuit 16 of FIG. 2 is provided by way of an input terminal 40 to the gates of two field effect transistors P5 and N3 connected as an inverter. The FETs 25 and N3, as well as the other FETs illustrated, may conveniently be fabricated using metal oxide semiconductor ("MOS") technology and the convention adopted in this application is that of using P or N according to semiconductor type.

The BIAS current from the power circuit 18 of FIG. 2 is applied by way of an input terminal 42 to a pair of FETs N5 and N6 which serve as a circuit mirror. The BIAS current may be derived in the power circuit 18 from the low side voltage VL in any suitable conventional manner and the magnitude thereto is selected to provide a constant current through the FET N5. The current through FET N5 is mirrored through FET N6 to provide a low impedance path from the FET N3 to ground when VL is adequate in the presence of the CONT.OFF signal.

Figure 4:
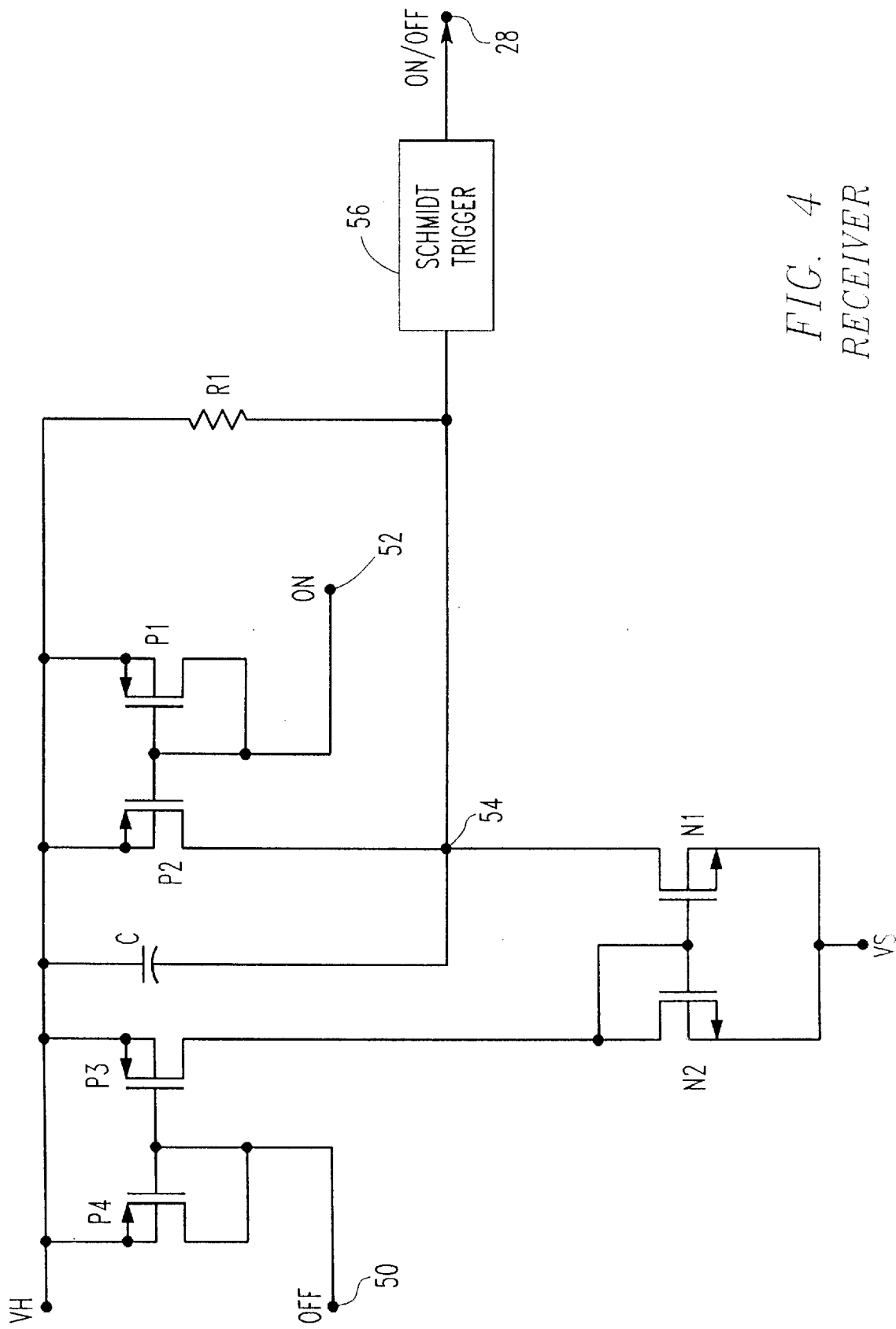
FIG. 4 is a schematic circuit diagram of one embodiment of the receiver circuit of FIG. 2.

In the presence of the CONT.OFF signal, the output signal from the inverter taken at terminal 44 pulls the source of the FET DMOS 2 down through the conducting FETs N3 and N6, and the output signal from the FET DMOS 2 may be taken from the drain thereof as the OFF signal for application to the receiver 26 and terminal 50 of FIG. 4.

The FET DMOS 2 and other DMOS FETs described herein may be higher voltage devices than the other DMOS FETs illustrated.

The source of the FET DMOS 2 is also grounded through a FET N4 which receives on the gate electrode thereof the PULSED OFF signal from the logic circuit 16 of FIG. 2. In the presence of the short duration PULSED OFF signal, the FET N4 conducts to pull the source of the FET DMOS 2 down to provide the OFF signal. Thus, the FET DMOS 2 will provide the OFF signal both during the short duration PULSED OFF signal and during the existence of the CONT-.OFF signal so long as adequate low voltage potential VL is available to generate the BIAS current.

The conduction of FET N4 is much faster in response to the relatively higher amplitude but short duration PULSED OFF signal and thus provides for faster switching speeds, after which the lower current conduction of the FETs N3 and N6 will continue the conduction of the FET DMOS 2 even after the PULSED OFF signal is removed from the gate of the FET N4.

With continued reference to FIG. 3, the PULSED ON signal from the logic circuit 16 of FIG. 2 may also be provided to an inverter comprising FETs P6 and N7 by way of an input terminal 48. In the presence of the PULSED ON signal, the FET N7 conducts pulling down the source of the FET DMOS 1 to provide an ON signal. Because there is no CONT.ON signal provided by the logic circuit 16 to the level shift circuit 22, the presence of the ON signal at the drain of the FET DMOS 1 will exist only so long as the PULSED ON signal is present.

With reference to the receiver 26 illustrated in FIG. 4, the OFF signal from the terminal 50 of the level shift circuit of FIG. 3 is applied to a current mirror comprising FETs 23 and P4. During the presence of the OFF signal, P4 conducts and the current therethrough is mirrored into the FET P3. The conduction of the FET P3 effects the conduction of the FET N2 in the current mirror comprising FETs N1 and N2, and the current through the FET N2 is mirrored into the FET N1. Conduction of the FET N1 pulls terminal 54 down to remove the effects of any conduction inducing signal on the input terminal of the Schmidt trigger 56, driving it to provide an OFF signal on the output terminal 28.

The receiver 26 of FIG. 4 also receives the short duration ON signal from the terminal 52 of the level shift circuit of FIG. 3. The ON signal is applied to the current mirror comprising FETs P1 and P2. Current in the FET P1 is mirrored into the FET P2 pulling the terminal 54 up to the supply voltage VH and to provide a conduction inducing signal the Schmidt trigger 56 and an ON signal on the output terminal 28.

A resistor R1 connected to the high voltage power supply VH will supply a conduction inducing signal on the input terminal of the Schmidt trigger 56 to maintain the ON/OFF output in the ON state in the absence of the OFF signal on input terminal 50 and the conduction of the FET N1. The resistor R1 thus serves, in the absence of the OFF signal, effectively as a CONT. ON signal and the OFF signal must be of sufficient magnitude to overcome this bias and reverse the state of conduction of the Schmidt trigger 56. The capacitor C is provided as a filter for noise that may appear on the voltages VH and VS, and in conjunction with the resistor R1 determines the length of time before the voltage applied to the Schmidt trigger 56 becomes adequate for conduction.

The Schmidt trigger 56 output signal ON/OFF is thus a signal indicative of the desired state of conduction of the switch SW 1 of FIG. 2. The Schmidt trigger 56 may be in a suitable conventional circuit, typically having a rising edge threshold of two-thirds of the voltage VH and a falling edge threshold at one-third of the voltage VH. Thus, the Schmidt trigger 56 will, once turned on, remain turned on until the voltage drops significantly, and once turned off, will remain off until the voltage rises substantially.

The receiver circuit 26 thus functions as a comparator and provides a voltage on the terminal 54 dependent upon which of the two mutually exclusive signals ON and OFF are present from the level shift circuit 22.

Figure 5:
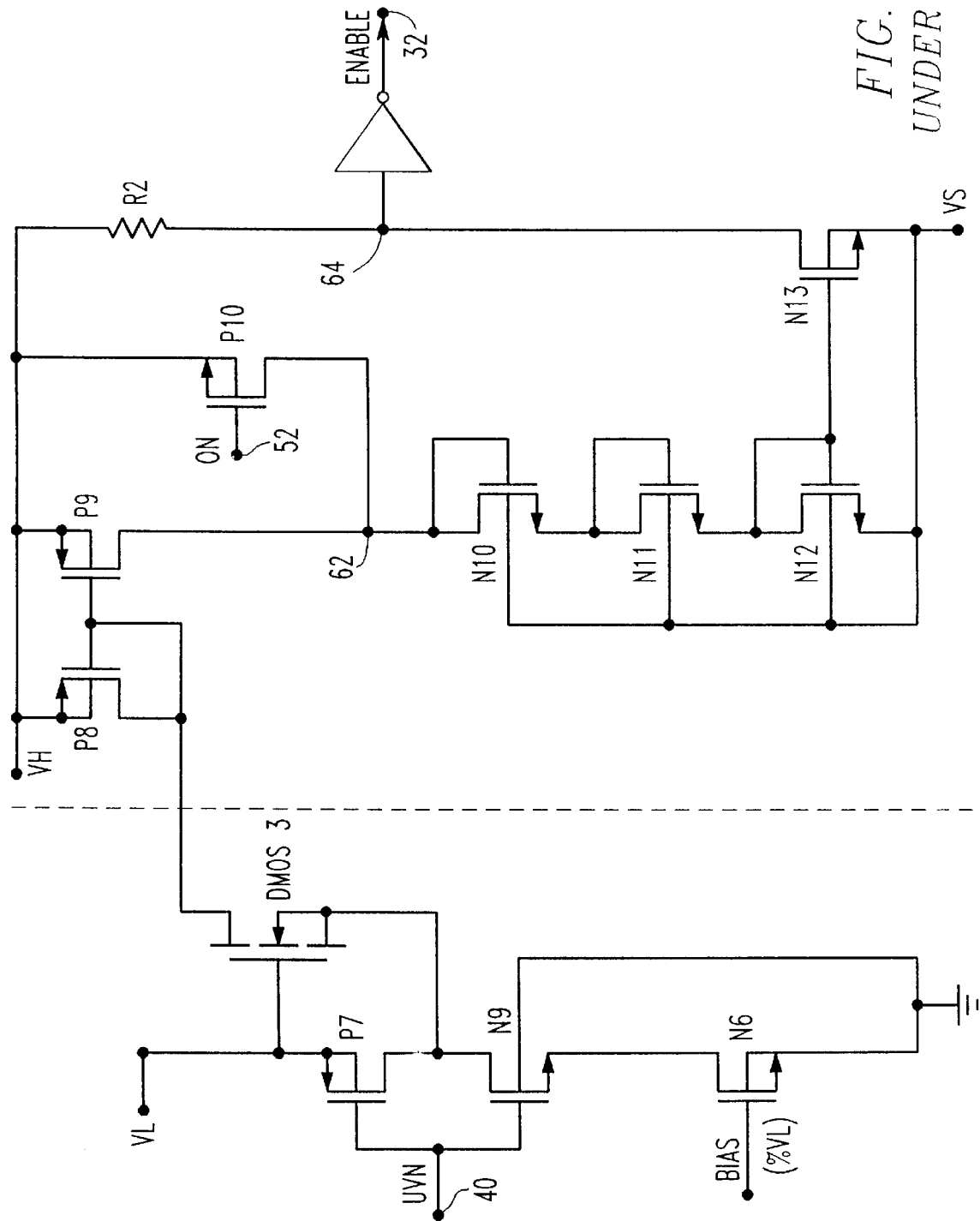
FIG. 5 is a schematic circuit diagram of one embodiment of the undervoltage circuit of FIG. 2.

With reference to the undervoltage circuit of FIG. 5, the circuit conveniently may be divided into an undervoltage circuit of the low side voltage VL to the left of the dashed line and undervoltage protection circuit for the high side voltage VH to the right of the dashed line.

As shown in FIG. 5, the UVN signal may be applied from the logic circuit 16 of FIG. 2 by way of an input terminal 60 to a pair of FETs P7 and N9 connected as an inverter. The signal UVN represents an "under voltage not" or "voltage adequate" condition and serves as an indication that there is no undervoltage condition in the low side voltage power supply VL.

The BIAS current, derived from the low side voltage VL when adequate, will cause conduction of the FET N8. With both the FET N9 conducting from the UVN signal and the FET N8 conducting from the BIAS current, the source of the FET DMOS 3 is pulled down to ground establishing current flow through the FET P8 in the high side under voltage protection circuit.

The current through the FET P8 is mirrored into the FET P9 and that current will effect the sequential conduction of the series connected FETs N10, N11 and N12 between VH and VS. Thus, when there is adequate high side voltage and low side voltage, the FET N12 will conduct and the current therethrough mirrored in FET N13, bringing the terminal 62 down to VS and providing a positive ENABLE signal on the output terminal 32.

The ON signal from the level shift circuit 22 of FIG. 3 may be applied by way of input terminal 52 to the gate of a FET P10 to effect the conduction thereof to improve noise immunity of this low power undervoltage circuit. The conduction of the FET P10 also provides current to the series connected FETs N10, N11 and N12 to effect the sequential conduction thereof. Thus, the FETs N10, N11 and N12, and in particular N10, may conduct in response to either (a) the presence of the ON signal or (b) the adequacy of both high side and low side voltage VH and VL. For this reason, the logic circuit 16 is typically designed so that it does not send a PULSED ON signal to the level shifter 22 when UVN is not present indicating that an undervoltage condition exists with respect to VL. Use of the ON signal in the undervoltage circuit 24 in this way enhances the current through 62 in noise situations where the current may be corrupted by providing a high current path to the FETs N10, N11, and N12.

As indicated above, the current through the FET N12 from the conduction of FET P10 is mirrored into the FET N13 which conducts to bring down the voltage at the terminal 64 which is seen as a positive ENABLE signal on the terminal 32.

As shown in FIG. 2, the presence of the ENABLE signal on one input terminal of the AND gate 30 will effectively pass the ON or OFF signal from the receiver 26 to the output terminal for control of the high side switch SW 1.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A bridge with a load connected to a power source through a high side switch means and connected to a power drain through a low side switch means comprising:

first control means for the low side switch means including a low side control voltage source;

second control means for the high side switch means including a high side control voltage source; and a logic circuit for controlling said first and second control means, said logic circuit providing both pulse and continuous signals to said second control means to effect at least one of turn-on and turn-off of said high side switch means.

2. The bridge of claim 1 wherein said bridge is an H-bridge with said load connected at the opposite ends thereof to said power source through two switches of said high side switch means and with said load connected at the opposite ends thereof to a power drain through two switches of said low side switch means; and wherein said logic circuit for controlling said first and second control means alternatively opens and closes one of said two switches of said high side switch means at one end of said load together with one of said two switches of said low side switch means at the other end of said load.

3. The bridge of claim 2 wherein said logic circuit for controlling said first and second control means alternatively opens and closes one of said two switches of said high side switch means at said other end of said load together with one of said two switches of said low side switch means at said one end of said load.

4. The bridge of claim 1 wherein said bridge is an half bridge with said load connected at one end thereof intermediate of said high side means and low side switch means and connected at the opposite end thereof to a power drain; and wherein said logic circuit for controlling said first and second control means alternatively opens and closes said high side and said low side switch means.

5. The bridge of claim 1 wherein said bridge is a 3-phase bridge having three parallel paths from said power source through said high side switch means and said low side switch means to a power drain;

wherein each of the three phases of said load are connected intermediate of a high side switch in said high side switch means and a low side switch in said low side switch means in one of said parallel paths; and wherein said logic circuit for controlling said first and second control means alternatively opens and closes the high side switch in one of said parallel paths together with the low side switch in both of the other of said three parallel paths.

6. The bridge of claim 1 wherein said second control means effects turn-on of said high side switch means in response to a pulse turn-on signal from said logic circuit and maintains said turned on high side switch means in conduction by a continuous signal initiated by said second control means during the presence of said pulse turn-on signal and terminated by the presence of a turn-off signal from said logic circuit.

7. The bridge of claim 1 wherein said second control means effecting turn-off of said high side switch means in response to a pulse turn-off signal from said logic circuit and inhibits the conduction of said turned off high side switch means in the presence of a continuous turn-off signal from said logic circuit.

8. The bridge of claim 1 including undervoltage means operative in the absence of an adequate low side control voltage for inhibiting the conduction of said high side switch means responsively to all turn-on signals from said logic circuit.

9. The bridge of claim 8 wherein said undervoltage means includes means for forcing said high side switch means into a nonconductive state.

10. The bridge of claim 1 including undervoltage means in the absence of either adequate high side or low side control voltages for inhibiting the conduction of said high side switch means responsively to all turn-on signals from said logic circuit.

11. The bridge of claim 10 wherein said undervoltage means includes means for forcing said high side switch means into a nonconductive state.

12. The bridge of claim 1 wherein said high side switch means includes two high side switches, and wherein said second control means includes individual control circuits for each of said high side switches.

13. The bridge of claim 1 wherein said first and second control means is an integrated circuit.

14. A control circuit for providing a conduction controlling output signal to a switch on the high side of a bridge with high side and low side switches and high side and low side switch control voltage sources comprising:

level shifting means (a) for receiving (i) a pulsed turn-on signal, and (ii) at least one of a pulsed or continuous turn-off signal, and (b) for providing a first signal when the pulsed turn-on signal is present and a second signal when either the pulsed or continuous turn-off signal is present;

receiving means (a) for receiving the first and second signals, (b) for providing a conduction controlling third signal representative of the desired condition of the switch being controlled, and (c) for maintaining the third signal in the absence of the second signal;

output means for providing the third signal to the switch being controlled.

15. The control circuit of claim 14 wherein the turn-off signal is a continuous signal.

16. The control circuit of claim 14 wherein there is both a pulsed and continuous turn-off signal.

17. The control circuit of claim 14 further comprising:

undervoltage protection means (a) for receiving (i) a signal representative of adequate low side supply voltage, and (ii) a bias signal, and (b) for providing an enable signal in the presence of adequate low side supply voltage, said output means being responsive to the enable and third signals for providing a conduction controlling output signal to the switch being controlled.

18. The control circuit of claim 14 further comprising:

undervoltage protection means (a) for receiving (i) signals representative of adequate high side and low side supply voltage, and (ii) a bias signal, and (b) for providing an enable signal in the presence of adequate low side and high side supply voltage, said output means being responsive to the enable and third signals for providing a conduction controlling output signal to the switch being controlled.

19. An integrated circuit control circuit for providing a conduction controlling output signal to a switch on the high side of a bridge with high side and low side switches and high side and low side control voltage sources comprising:

level shifting means (a) for receiving (i) a pulsed turn-on signal (ii) a continuous turn-off signal, and (iii) a bias signal, and (b) for providing a first signal when the pulsed turn-on signal is present and a second signal when the bias signal and the continuous turn-off signal are present, the pulsed turn-on and the continuous turn-off signals being mutually exclusive;

receiving means (a) for receiving the first and second signals, (b) for providing a switch conduction inducing a third signal in response to the first signal, and (c) for maintaining the third signal in the absence of the second signal; and output means for providing the third signal to the switch being controlled.

20. The control circuit of claim 19 wherein said level shifting means includes means for receiving a pulsed turn-off signal; and wherein the second signal is provided in the presence of (a) the bias signal, and (b) either (i) the pulsed turn-off signal, or (ii) the continuous turn-off signal.

21. The control circuit of claim 19 further comprising:

undervoltage protection means (a) for receiving a signal representative of adequate low side supply voltage, and (b) for providing an enable signal in the presence of adequate low side supply voltage; and wherein said output means is responsive to the enable and third signals for providing a conduction controlling output signal to the switch being controlled.

22. The control circuit of claim 19 further comprising:

undervoltage protection means (a) for receiving signals representative of adequate high side and low side supply voltage, and (b) for providing an enable signal in the presence of adequate low side and high side supply voltage; and wherein said output means is responsive to the enable and third signals for providing a conduction controlling output signal to the switch being controlled.

23. A method of controlling the conduction of a switch responsively to logic signals comprising the steps of:

(a) providing a conduction effecting signal to the switch in response to a pulsed turn-on logic signal;

(b) providing a conduction maintaining signal to the switch in the absence of a turn-off logic signal; and (c) providing a conduction interrupting signal to the switch in response to either a pulsed turn-off logic signal or a continuous turn-off logic signal, the turn-off logic signals being mutually exclusive with the pulsed turn-on logic signal and either of the turn-off logic signals being effective to eliminate the conduction maintaining signal.

24. The method of claim 23 wherein the switch is in the high side of a bridge circuit.

* * * * *